United States Patent
Alfieri et al.

(10) Patent No.: US 12,453,150 B2
(45) Date of Patent: Oct. 21, 2025

(54) MANUFACTURING METHOD FOR POWER SEMICONDUCTOR DEVICE USING LOW-ENERGY ELECTRON RADIATION TO PRODUCE SILICON-ENRICHED LAYER

(71) Applicant: Hitachi Energy Ltd, Zürich (CH)

(72) Inventors: Giovanni Alfieri, Möriken (CH); Gianpaolo Romano, Baden (CH)

(73) Assignee: HITACHI ENERGY LTD, Zurich (CH)

( * ) Notice: Subject to any disclaimer, the term of this patent is extended or adjusted under 35 U.S.C. 154(b) by 0 days.

(21) Appl. No.: 18/846,211

(22) PCT Filed: Jan. 30, 2023

(86) PCT No.: PCT/EP2023/052132
§ 371 (c)(1),
(2) Date: Sep. 11, 2024

(87) PCT Pub. No.: WO2023/174610
PCT Pub. Date: Sep. 21, 2023

(65) Prior Publication Data
US 2025/0113570 A1    Apr. 3, 2025

(30) Foreign Application Priority Data
Mar. 15, 2022 (EP) .................. 22162144

(51) Int. Cl.
H01L 21/26 (2006.01)
H01L 21/04 (2006.01)
(Continued)

(52) U.S. Cl.
CPC ..... H10D 62/8325 (2025.01); H01L 21/0475 (2013.01); H10D 64/027 (2025.01)

(58) Field of Classification Search
CPC ......... H01L 21/02378; H01L 21/02529; H01L 21/02447; H10D 62/8325; H10D 64/027
See application file for complete search history.

(56) References Cited

U.S. PATENT DOCUMENTS

| | | |
|---|---|---|
| 2002/0034852 A1 | 3/2002 | Alok |
| 2012/0241767 A1 | 9/2012 | Yano et al. |

(Continued)

FOREIGN PATENT DOCUMENTS

| | | |
|---|---|---|
| CN | 114005742 A | 2/2022 |
| JP | 2011109018 A | 6/2011 |

(Continued)

OTHER PUBLICATIONS

"Low-temperature chemical-vapor deposition of 3C—SiC films on Si(1 0 0) using SiH4—C2H4—HCl—H2" by Y. Gao, J.H. Edgar, J. Chaudhuri, S.N. Cheema, M.V. Sidorov, D.N. Braski in Journal of Crystal Growth 191 (1998) 439-445 (Year: 1998).*

(Continued)

*Primary Examiner* — Eric A. Ward
(74) *Attorney, Agent, or Firm* — Procopio, Cory, Hargreaves & Savitch LLP

(57) ABSTRACT

A method for producing a power semiconductor device comprises providing a semiconductor body based on SiC, irradiating at least a first portion of a top side of the semiconductor body with low-energy electron radiation, and producing an electrical insulation layer at least in the at least one irradiated first portion.

11 Claims, 4 Drawing Sheets

(51) Int. Cl.
  *H10D 62/832* (2025.01)
  *H10D 64/01* (2025.01)

(56) References Cited

U.S. PATENT DOCUMENTS

| | | | |
|---|---|---|---|
| 2013/0168698 A1* | 7/2013 | Lee | H10D 30/60 257/77 |
| 2017/0141206 A1 | 5/2017 | Koga | |
| 2018/0308937 A1 | 10/2018 | Hirose et al. | |
| 2019/0296146 A1 | 9/2019 | Shimizu et al. | |
| 2022/0028976 A1* | 1/2022 | Wirths | H10D 30/751 |

FOREIGN PATENT DOCUMENTS

| | | | |
|---|---|---|---|
| JP | 2019169487 A | 10/2019 | |
| JP | 2022508324 A | 1/2022 | |

OTHER PUBLICATIONS

"The effects of displacement threshold irradiation energy on deep levels in p-type 6H—SiC" by G Alfieri and T Kimoto in J. Phys.: Condens. Matter 23 (2011) 065803 (Year: 2011).*

"Deep levels created by low energy electron irradiation in 4H—SiC" by L. Storasta, J. P. Bergman, E. Janzen, and A. Henry, in J. Appl. Phys. 96, 4909-4915 (2004) (Year: 2004).*

Aaron Modic et al., "High Channel Mobility 4H—SiC MOSFETs by Antimony Counter-Doping", IEEE Electron Device Letters, vol. 35, No. 9, Sep. 2014, 3 pages.

D. Dutta et al., "Evidence for carbon clusters present near thermal gate oxides affecting the electronic band structure in SiC-MOSFET", Applied Physics Letters, 101601, Sep. 6, 2019, 5 pages.

Fabien Devynck, "Defect levels of carbon-related defects at the SiC/SiO2 interface from hybrid functionals"; Physical Review B 83, 195319, 2011, 11 pages.

Francesco Moscatelli et al., "Nitrogen Implantation to Improve Electron Channel Mobility in 4H—SiC MOSFET", IEEE Transactions on Electron Devices, vol. 55, No. 4, Apr. 2008, 7 pages.

Gang Liu et al., "Enhanced Inversion Mobility on 4H—SiC (1120) Using Phosphorus and Nitrogen Interface Passivation", IEEE Electron Device Letters, vol. 34, No. 2, 2013, 4 pages.

K. Danno et al., "Investigation of carrier lifetime in 4H—SiC epilayers and lifetime control by electron irradiation", Applied Physics Letters 90, 202109, 2007, 4 pages.

Koutarou Kawahara et al., "Reduction of deep levels generated by ion implantation into n- and p-type 4H—SiC", Journal of Applied Physics 108, 033706, 2010, 7 pages.

Liutauras Storasta and Hidekazu Tsuchida, "Reduction of traps and improvement of carrier lifetime in 4H—SiC epilayers by ion implantation", Applied Physics Letters 90, 062116, 2007, 4 pages.

P. Fiorenza et al., "SiO2/4H—SiC interface doping during post-deposition-annealing of the oxide in N2O or POCl3", Applied Physics Letters 103, 153508, 2013, 5 pages.

P. Jamet and S. Dimitrijev, "Physical properties of N2O and NO-nitrided gate oxides grown in 4H SiC", Applied Physics Letters, vol. 79, No. 4, 2001, 4 pages.

T. Sledziewski et al., "Reduction of density of 4H—SiC/SiO2 interface traps by pre-oxidation phosphorus implantation", Materials Science Forum vols. 778-780, 2014, 4 pages.

U. Gerstmann et al., "Formation and annealing of nitrogen-related complexes in SiC", Physical Review B 67, 205202, 2003, 8 pages.

Yasuto Hijikata et al., "A Kinetic Model of Silicon Carbide Oxidation Based on the Interfacial Silicon and Carbon Emission Phenomenon", Applied Physics Express 2, (2009) 021203, 2009, 3 pages.

International Preliminary Report on Patentability issued in related PCT/EP2023/052132, dates Jun. 26, 2024, 32 pages.

* cited by examiner

MANUFACTURING METHOD FOR POWER SEMICONDUCTOR DEVICE USING LOW-ENERGY ELECTRON RADIATION TO PRODUCE SILICON-ENRICHED LAYER

The present application is a national stage entry of International Patent Application No. PCT/EP2023/052132, filed on Jan. 30, 2023, which claims priority to European Patent Application No. 22162144.4, filed on Mar. 15, 2022, the disclosures of which are hereby incorporated herein by reference as if set forth in full.

FIELD OF THE INVENTION

The present invention relates to manufacturing methods for a power semiconductor device.

BACKGROUND OF THE INVENTION

Document US 2019/0296146 A1 refers to a semiconductor device that includes a silicon carbide layer, a gate electrode, a gate insulating layer disposed between the silicon carbide layer and the gate electrode, a first region disposed in the silicon carbide layer and containing nitrogen, and a second region disposed between the first region and the gate insulating layer, and containing at least one element selected from the group consisting of nitrogen, phosphorus, arsenic, antimony, scandium, yttrium, lanthanum, lanthanoids (Ce, Pr, Nd, Pm, Sm, Eu, Gd, Tb, Dy, Ho, Er, Tm, Yb, Lu), hydrogen, deuterium, and fluorine.

Document US 2002/0034852 A1 refers to semiconductor devices having at least one silicon region in a silicon carbide wafer in which is fabricated a low voltage semiconductor device such as for example, MOSFET devices, BiCMOS devices, Bipolar devices, etc., and on the same chip, at least one silicon carbide region in which is fabricated a high voltage (i.e., >1000V) semiconductor device using techniques well known in the art, such as for example, LDMOSFET, UMOSFET, DMOSFET, IGBT, MESFET, and JFET devices. Such devices are derived from a method for forming a silicon region on a silicon carbide substrate which comprises the steps of: providing a monocrystalline silicon carbide substrate, amorphizing at least one region of the substrate, preferably by subjecting at least a portion of a surface of the substrate to ion implantation to convert at least a portion of the substrate surface to amorphous silicon carbide producing a region of amorphous silicon carbide on a monocrystalline silicon carbide substrate, removing at least an effective amount of carbon from said amorphized region, preferably by subjecting at least a portion of the amorphous silicon carbide region to an etchant material which selectively removes carbon to produce a region of amorphous silicon on a monocrystalline silicon carbide substrate, and subjecting the monocrystalline substrate with at least a region of amorphous silicon to high temperature thermal anneal to produce a region of monocrystalline silicon on said monocrystalline silicon carbide substrate.

SUMMARY OF THE INVENTION

A problem to be solved is to provide a power semiconductor device having improved electric behaviour.

This object is achieved by a manufacturing method any by a power semiconductor device as specified in the independent patent claims. Further exemplary embodiments are specified in the dependent patent claims.

In the method described herein low-energy electron radiation is used in order to improve flat band voltage, $V_{FB}$, and reduce carbon, C, defects at an oxide-SiC interface at a $SiO_2$/SiC interface.

The method is for producing a power semiconductor device and comprises the following steps, for example, in the stated sequence:
  providing a semiconductor body based on a carbon-containing semiconductor material, like SiC,
  irradiating at least one first portion of a top side of the semiconductor body with low-energy electron radiation, and
  producing an electrical insulation layer at least in the at least one irradiated first portion. The low-energy electron radiation has a kinetic energy of at least 116 keV and at most 210 keV, by means of the low-energy electron radiation in the at least one first portion carbon atoms are moved from the top side into the semiconductor body so that after irradiating the at least one first portion, there the semiconductor body has a layer of $Si_{0.5+x}C_{0.5-x}$, wherein x is at least 0.001 and is at most 0.1, said layer has a thickness of at least 10 nm and of at most 0.2 μm.

Despite the high bulk mobility of SiC, low inversion-channel mobilities μ have been reported in SiC metal-oxide-semiconductor field-effect transistors, MOSFETs, leading to a much higher on-state resistance than what is expected from bulk SiC properties. This discrepancy has been attributed to the large density of interface states, $D_{it}$, at an $SiO_2$/SiC interface, which is one to three orders of magnitude higher than in the case of an $SiO_2$/Si interface. The nature of $D_{it}$ close to the edge of the conduction band is generally attributed to the presence of C-related defects and intrinsic oxide acceptor defects. The presence of carbon in the SiC epilayer is due to injection during oxidation. The injected C atoms form clusters that give rise to acceptor levels close to the conduction band. These levels shorten charge carriers' lifetime and act as scattering centers, thus reducing μ.

In order to improve the electronic properties of a SiC MOSFET, the concentration of C defects, $D_{it}$, at the $SiO_2$/n-type 4H—SiC interface should be reduced.

In the method described herein, pre-oxidation low-energy electron irradiation for defect reduction at the $SiO_2$/n-type 4H-SiC interface is used.

For n-type channel MOSFETs, different ways of reducing $D_{it}$ are possible, such as the post-oxidation annealing, POA, and pre-oxidation implantation, POI. POA in either $N_2O$ or $POCl_3$ ambient, or POI, by either N, P or Sb donor impurities, results in a decrease of $D_{it}$ in the upper part of SiC band gap ($10^{11}$ cm$^{-2}$ eV$^{-1}$ for POA, low $10^{12}$ cm$^{-2}$ eV$^{-1}$ for POI) and increase of μ (90 cm$^2$ V$^{-1}$ s$^{-1}$ for POA, 20 cm$^2$ V$^{-1}$ s$^{-1}$ to 100 cm$^2$ V$^{-1}$ s$^{-1}$ for POI). The reason for the reduction of $D_{it}$, and subsequent u increase, has been explained in terms of N or P atoms passivating the C-clusters or in terms of counter-doping. Nevertheless, both POA and POI have some drawbacks: the concentration of incorporated N or P is difficult to control by POA and flat-band voltage, $V_{FB}$, shift, due to the introduction of N or P or Sb in $SiO_2$, can occur. In addition, since P is more easily incorporated into SiC than N, normally-on devices can be obtained.

One idea of the present method is, inter alia, to employ low energy electron irradiation in order to create a C-poor, that is, a layer rich of voids of C, also referred to as a $V_C$-rich layer. This will act as a sink for C, leading to an improved $V_{FB}$ and the reduction of $D_{it}$ at the $SiO_2$/4H—SiC interface.

In order to produce $V_C$, low energy electron irradiation is employed, for example, with an energy between 116 keV and 210 keV. This is the minimum energy required in order to produce the displacement of C atoms, that is, $V_C$. In this way, virtually no other defects will be formed, either complex or Si-related, as occur after impurity implantation or higher energy electron irradiation.

Following irradiation, $[V_C]$ increases and the displaced carbon interstitial ($C_I$) atoms will be in-diffused deep in the bulk by thermal annealing treatment at, for example, at most 500° C. Although $C_I$ is mobile even at room temperature, a thermal treatment can prevent C atoms displaced by irradiation from clustering during oxidation.

For an Al implanted n-type 4H—SiC epilayer, $[V_C]$ is $6\times10^{15}$ cm$^{-3}$. After dry oxidation at 1150° C. for 2 h, $[V_C]$ becomes $3\times10^{15}$ cm$^{-3}$, meaning that about $3\times10^{15}$ cm$^{-3}$ $[C_I]$ have been injected during oxidation. This means that prior to the formation of, for example, a 65 nm thick SiO$_2$, the as-grown n-type epilayer should be irradiated with an electron dose such that $[V_C]$ is at least $3\times10^{15}$ cm$^{-3}$, for example. In this way, a C-poor layer is formed and during oxidation, little $C_I$ will cluster to form $D_{it}$.

With the method described herein, for example, the following benefits could be achieved:
1. $[V_C]$ can be controlled by varying the electron irradiation dose, so to trap C atoms injected during oxidation.
2. Unlike POA or POI, impurities are not incorporated in the oxide.
3. No high annealing temperatures, for example, of about 1300° C. are necessary, as for POA.
4. Unlike N, P or Sb implantation, unwanted impurity-related complexes or other defects are not created.
5. The absence of implanted donor impurities, such as P, close to the surface, prevents normally-on conditions.
6. Reverse engineering is possible in the final product, by monitoring $[V_C]$ deep in the epilayer, by deep level transient spectroscopy, DLTS, or by photoluminescence, or by performing constant capacitance deep level transient spectroscopy, CC-DLTS.
7. Improved on-state resistance, $R_{ON}$, and lower $D_{it}$ can be achieved.

A kinetic energy of electrons of the low-energy electron radiation is at least 116 keV. Additionally, this energy is at most 210 keV. This means, for example, that at least 90% or at least 99% or at least 99.9% of the electrons of the low-energy electron radiation have said kinetic energy. By having such an energy, C atoms of the SiC lattice can specifically be addressed by the radiation to be moved away from the top side.

According to at least one embodiment, a dose of the low-energy electron radiation in the first portion is at least $10^{10}$ cm$^{-2}$ or is at least $10^{12}$ cm$^{-2}$ or is at least $10^{14}$ cm$^{-2}$. Alternatively or additionally, it is possible that said dose is at most $10^{17}$ cm$^{-2}$ or is at most $10^{16}$ cm$^{-2}$ or at most $10^{15}$ cm$^{-2}$.

According to at least one embodiment, the electrical insulation layer is produced by thermal growth. For example, in gas phase the constituents of the electrical insulation layer are provided, which are Si and O for SiO$_2$. For example, a temperature during producing the electrical insulation layer is at least 600° C. or at least 800° C. or at least 1000° C. Alternatively or additionally, this temperature is at most 1500° C. or at most 1300° C. or at most 1150° C.

According to at least one embodiment, the producing the electrical insulation layer includes annealing a previously applied material of the electrical insulation layer. It is possible that all or most of the material of the electrical insulation layer has been applied on the top side of the semiconductor body prior to the annealing.

For example, a temperature during annealing the electrical insulation layer is at least 200° C. or at least 300° C. or at least 400° C. Alternatively or additionally, this temperature is at most 1000° C. or at most 800° C. or at most 600° C. For example, the annealing takes at least 0.5 h or at least 1 h and/or the annealing takes at most 12 h or at most 4 h. It is possible that a temperature during the annealing is lower than during application of the material of the electrical insulation layer.

Optionally, during annealing and/or during thermal growth at least one temperature ramp may be applied.

According to at least one embodiment, the annealing is done in a nitrogen-containing atmosphere. For example, the annealing is done in an $N_2$ atmosphere, which may be free or virtually free of oxygen, or even in air or in one of $N_2O$, NO, $O_2$ or $O_3$. The same may apply for the thermal growth of the electrical insulation layer.

According to at least one embodiment, the irradiating the at least one first portion is done in a nitrogen-containing atmosphere, which may be free or virtually free of oxygen, or which may be air or also in one of $N_2O$, NO, $O_2$ or $O_3$.

According to at least one embodiment, the top side of the semiconductor body is a planar surface of the semiconductor body. Hence, the power semiconductor device may be of planar design.

According to at least one embodiment, the method further includes the step of forming one or more trenches into the semiconductor body. For example, the at least one trench is formed into the semiconductor body prior to irradiating the at least one first portion. The at least one trench may be produced by etching. Thus, the resulting power semiconductor device could be of a trench design.

According to at least one embodiment, the at least one first portion includes side walls and a bottom face of the at least one trench. It is possible that the at least one first region is limited to the side walls and/or to the bottom face of the at least one trench.

According to at least one embodiment, the method includes that prior to irradiating the at least one first portion, a mask material is applied on the top side. By means of the mask material, regions of the top side to be irradiated can be defined, or a penetration depth of the low-energy electron radiation into the semiconductor body may be adjusted by means of the mask material or by means of a thickness of the mask material, for a specified material.

According to at least one embodiment, during irradiating the at least one first portion the at least one first portion is free of the mask material while remaining portions of the top side are partially or completely covered by the mask material. If the penetration depth of the low-energy electron radiation into the semiconductor body is to be adjusted by means of the mask material in the first portion, too, it is possible that the at least one first portion is partially provided with the mask material, possible with a reduced thickness compared with the other regions of the top side. Even the whole at least one first portion may be covered with a thin layer of the mask material.

Using not only one, but a plurality of different mask materials is also possible.

By means of the low-energy electron radiation in the at least one first portion carbon atoms are moved from the top side into the semiconductor body. That is, after irradiating the at least one first portion, the semiconductor body is of non-stoichiometric SiC. That is, in this area the semiconductor body has a thin layer of $Si_{0.5+x}C_{0.5-x}$, wherein x is at least 0.001 or at least 0.01 and/or x is at most 0.1 or at most 0.02. Said layer may have a thickness of at least 10 nm or of at least 100 nm. Said thickness is at most 0.2 μm.

A power semiconductor device is additionally provided. The power semiconductor device is produced, for example, by means of the method as indicated in connection with at least one of the above-stated embodiments. Features of the power semiconductor device are therefore also disclosed for the method and vice versa.

In at least one embodiment, the power semiconductor device comprises a semiconductor body based on SiC and an electrical insulation layer applied in at least one first portion of a top side of the semiconductor body, wherein next to the electrical insulation layer the semiconductor body is silicon-enriched and, thus, poor of carbon, for example, compared with stoichiometric SiC.

According to at least one embodiment, the power semiconductor device is a metal-insulator-semiconductor field-effect transistor, MISFET, or an insulated gate-bipolar transistor, IGBT.

According to at least one embodiment, the power semiconductor device is configured for an operating voltage of at least 0.6 kV or of at least 1.2 kV. Alternatively or additionally, the power semiconductor device is configured for an operating voltage of at most 10 kV or of at most 6 kV.

According to at least one embodiment, the power semiconductor device is configured for an operating current of at least 10 A or of at least 0.1 kA or of at least 1 kA. Alternatively or additionally, the power semiconductor device is configured for an operating current of at most 20 kA or of at most 5 kA.

According to at least one embodiment, the power semiconductor device is a device selected from the following group: a metal-oxide-semiconductor field-effect transistor (MOSFET), an insulated-gate bipolar transistor (IGBT), a gate turn-off thyristor (GTO), a gate commutated thyristor (GCT), a junction gate field-effect transistor (JFET).

The power semiconductor device is, for example, configured to be used to convert direct current, for example, from a battery to alternating current, for example, for an electric motor. The power semiconductor device may be used, for example, in vehicles like hybrid vehicles or plug-in electric vehicles or also in railways, like commuter trains.

A method described herein and a power semiconductor device described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

DETAILED DESCRIPTION OF THE INVENTION

Figure 1:
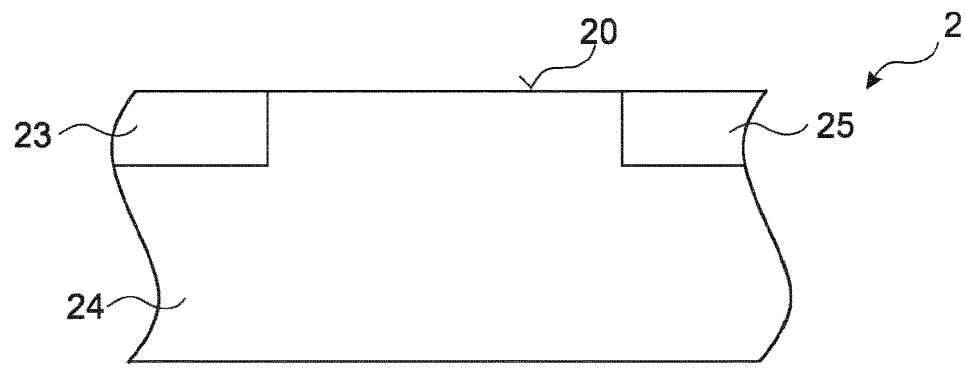
FIGS. 1 to 3 show schematic sectional views of method steps of an exemplary embodiment of a method for producing power semiconductor devices described herein.
Figure 2:
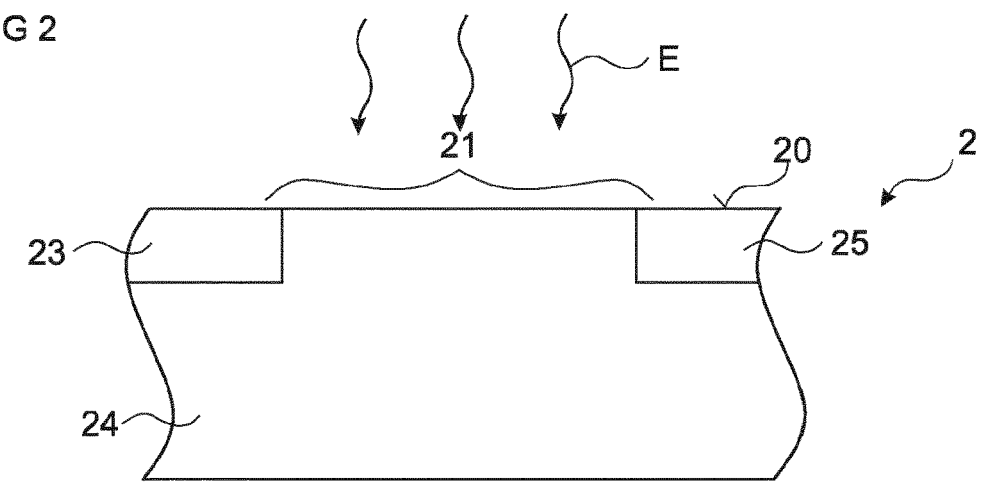
Figure 3:
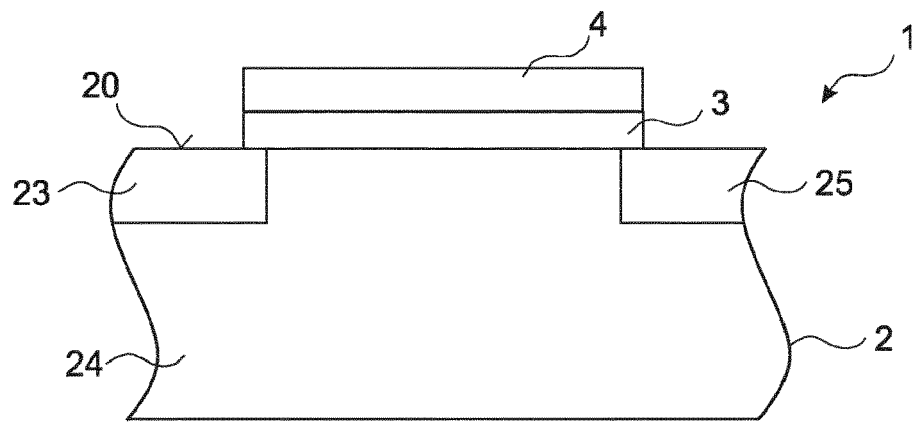

In FIGS. 1 to 3, an example of a method to produce a power semiconductor device 1 is illustrated.

According to FIG. 1, a semiconductor body 2 is provided. The semiconductor body 2 is based on SiC. For example, the semiconductor body 2 includes a substrate and at least one epitaxially grown semiconductor layer thereon, not shown, wherein both are based on SiC. The semiconductor body 2 has a plane top side 20.

For example, the semiconductor body 2 includes a well region 24 which may be of n-type 4H—SiC. Further there can be two p-type regions in the semiconductor body 2. These regions may be a source region 23 and a drain region 5, if the semiconductor body 2 is to be configured as a MOSFET.

According to FIG. 2, a first portion 21 of the semiconductor body 2 is irradiated with a low-energy electron radiation E. As the top side 20, the first portion 21 is planar. It is possible that the low-energy electron radiation E is limited to the first portion 21 or that more of the top side 20 is exposed to the low-energy electron radiation E. For example, the first portion 21 completely extends between the doped regions 23, 25 and may also include the doped regions 23, 25 partially, seen in top view of the top side 20.

Although only one first portion 21 is illustrated in context of FIG. 2, there can be a plurality of the first portions 21. Likewise, there can be much more than two of the doped regions 24, 25.

A kinetic energy of electrons of the low-energy electron radiation E is at least 116 keV and at most 210 keV. As an option, a dose of the low-energy electron radiation E in the first portion 21 is at least $10^{12}$ cm$^{-2}$ and at most $10^{17}$ cm$^{-2}$.

For example, the irradiating with the radiation E is done in air or a nitrogen atmosphere. Thus, no vacuum may be required in the step of FIG. 2.

In the method step of FIG. 3, an electrical insulation layer 3 is applied to the top side 20 of the semiconductor body 2 in the first portion 21. The electrical insulation layer 3 is produced for example, as a thermal oxide at an elevated temperature of, for example, at least 1000° C. Optionally, after applying a material of the electrical insulation layer 3, annealing can be performed, for example, in an atmosphere of one of $N_2O$, NO, $O_2$ or $O_3$.

The electrical insulation layer 3 is of $SiO_2$.

By means of the low-energy electron radiation E, carbon atoms are removed from a region next to the top side 20 in the first portion 21 so that in the first portion Si-rich SiC is present. Thus, electrical behavior can be improved as hampering the properly forming the oxide layer of the electrical insulation layer 3 by C clusters is suppressed.

Further, in FIG. 3 it is shown that on a side of the electrical insulation layer 3 remote from the semiconductor body 3 a gate electrode 4 is formed. The gate electrode 4 may be of a metal or of an ohmically conductive semiconductor material like poly-Si. Depending on the material of the gate electrode 4, the annealing step may be performed after applying a material of the gate electrode 4 so that combined annealing may occur.

The finished power semiconductor device 1 is, for example, a power MOSFET or also an IGBT. In case of an IGBT, of course, there is no drain region but there may be a collector region as well as a drift region. Further electrodes beside the gate electrode 4, like a source electrode, a drain electrode or a collector electrode, are not illustrated in the figures.

For example, the finished power semiconductor device 1 is configured for currents of at least 10 A and/or of at most 10 kA. Alternatively or additionally, the power semiconductor device 1 is configured for a voltage of at least 0.6 kV and/or of at most 6 kV.

Figure 4:
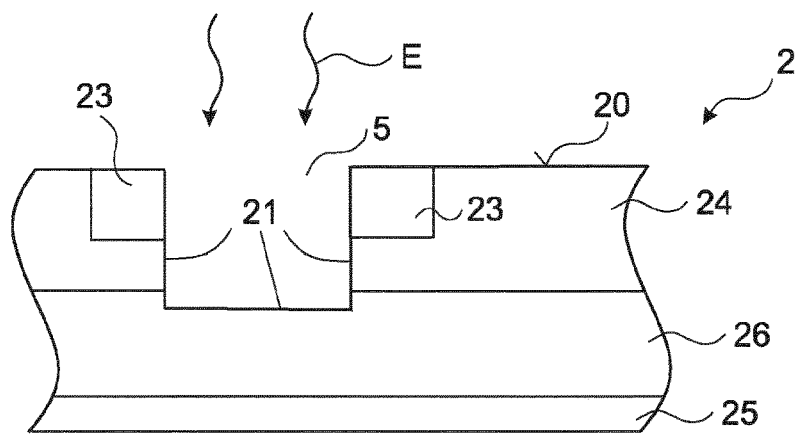
FIGS. 4 and 5 show schematic sectional views of method steps of an exemplary embodiment of a method for producing power semiconductor devices described herein.
Figure 5:
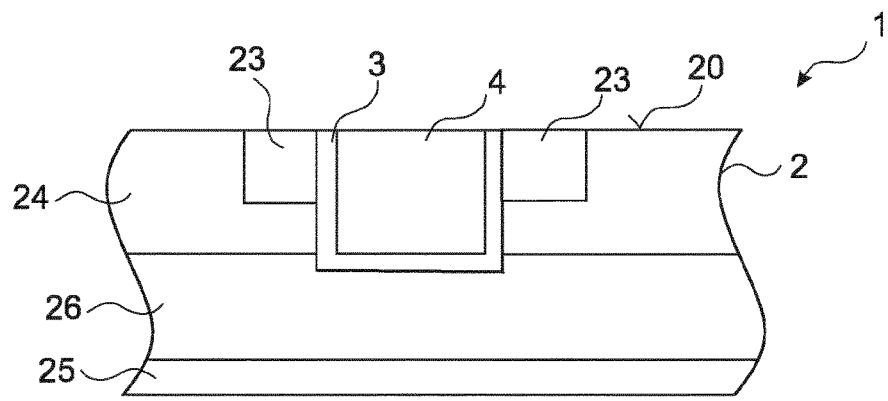

In FIGS. 4 and 5, another example of a manufacturing method is illustrated. According to FIG. 4, the semiconductor body 4 is provided, and a trench 5 is formed in the semiconductor body 2.

In this case, the finished power semiconductor device 1 will be configured as an IGBT. Thus, the semiconductor body 5 includes a source region 23 at the top side 20. As an option, the source region 23 is divided by the trench 5 in two sub-regions. The source region 23 is embedded in the well region 24. On a side of the well region 24 remote from the top side 20, there is a drift region 26. On a side of the drift region 26 remote from the drift region 26, there is a collector region 25. Again, electrodes for the various semiconductor regions 23, 24, 25 are not illustrate for simplifying the drawing.

For example, the trench 5 extends from the top side 20 into the drift region 26 and terminates within the drift region 26. Other than shown, the trench 5 does not need to have a planar bottom face but could have a rounded bottom face or even a V-shaped bottom region, seen in cross-section perpendicular with the top side 20.

Moreover, according to FIG. 4 at least side walls and the bottom face of the trench 5 are irradiated with the low-energy electron radiation E. That is, the first portion 21 could be composed of said side walls and bottom face. Other parts of the top side 20, outside the trench 5, may also be irradiated with the low-energy electron radiation E.

Contrary to what is shown in FIG. 4, there can be a plurality of the trenches 5.

According to FIG. 5, after irradiating the first portion 21 with the radiation E, the electrical insulation layer 3 is applied on the side walls and on the bottom face of the trench 5. In FIG. 5, the electrical insulation layer 5 has a constant thickness all along the trench side walls and the bottom face, however, it is also possible that the electrical insulation layer 3 has a varying thickness.

Then, the remaining portion of the trench 5 is filled with the gate electrode 4.

Otherwise, the same as to FIGS. 1 to 3 may apply for FIGS. 4 and 5, and vice versa.

Figure 6:
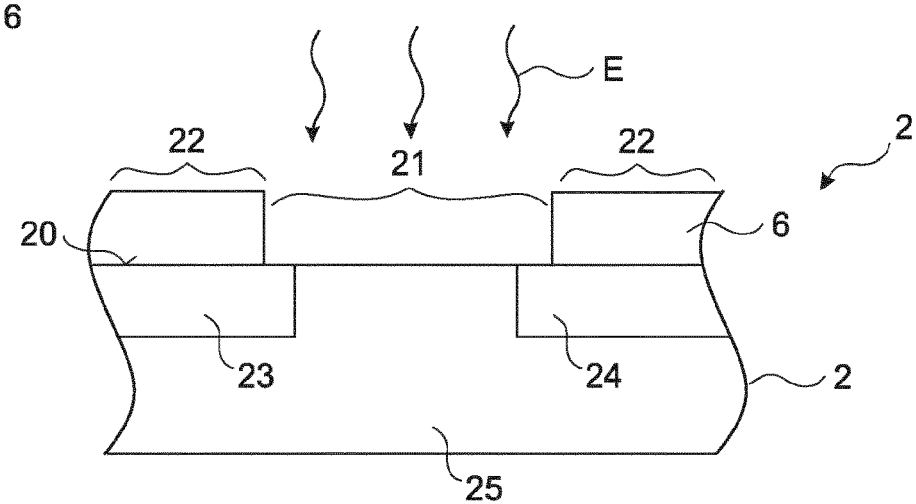
FIG. 6 shows a schematic sectional view of a method step of an exemplary embodiment of a method for producing power semiconductor devices described herein.

In FIG. 6, another method to produce the power semiconductor device 1 is illustrated. In this case, a mask material 6 is applied to the top side 20 outside the first portion 21. Thus, second portions 22 outside the first portion 21 may not be irradiated with the low-energy electron radiation E. Accordingly, the first portion 21 can be accurately defined by the mask material 6. A thickness of the mask material 6 can amount to at least 10 µm or to at least 30 µm, for example.

Otherwise, the same as to FIGS. 1 to 5 may apply for FIG. 6, and vice versa.

Figure 7:
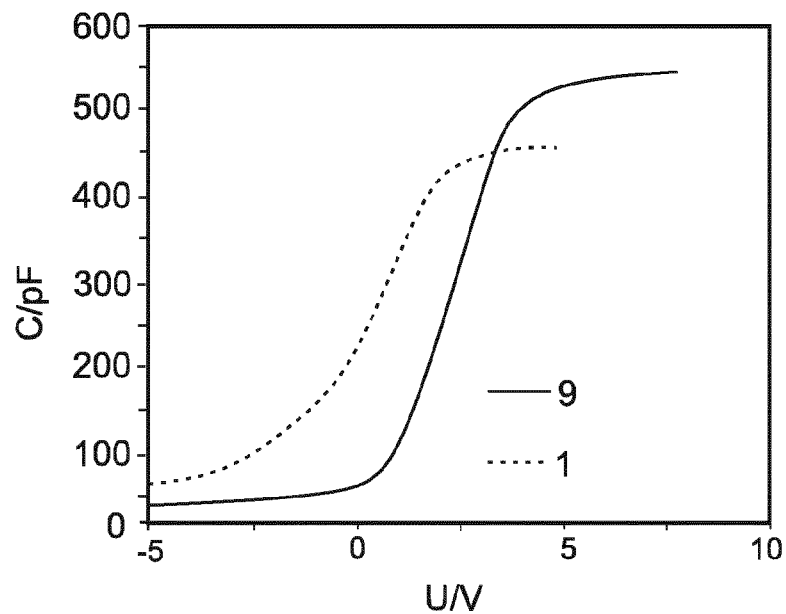
FIG. 7 shows a comparison of a voltage vs. capacitance characteristic between an exemplary embodiment of a power semiconductor device described herein and a modified device.

FIG. 7 shows a comparison of a measured voltage U vs. capacitance C characteristic between an exemplary embodiment of a power semiconductor device 1 described herein and a modified device 9. The modified device 9 corresponds to the power semiconductor device 1 beside the irradiating with the low-energy electron radiation E. Both devices 1, 9 are MOS capacitors.

The theoretical flat band voltage, $V_{FB}$, is obtained by the difference between the gate metal work function and the semiconductor work function: $V_{FB} = \Box_M - \Box_S$. This results in a value for $V_{FB}$ of 0.14 eV. From the measured U—C characteristic, a $V_{FB}$ of 0.38 eV for the pre-irradiated MOS device 1 and 1.80 eV for the reference device 9 can be extracted.

Figure 8:
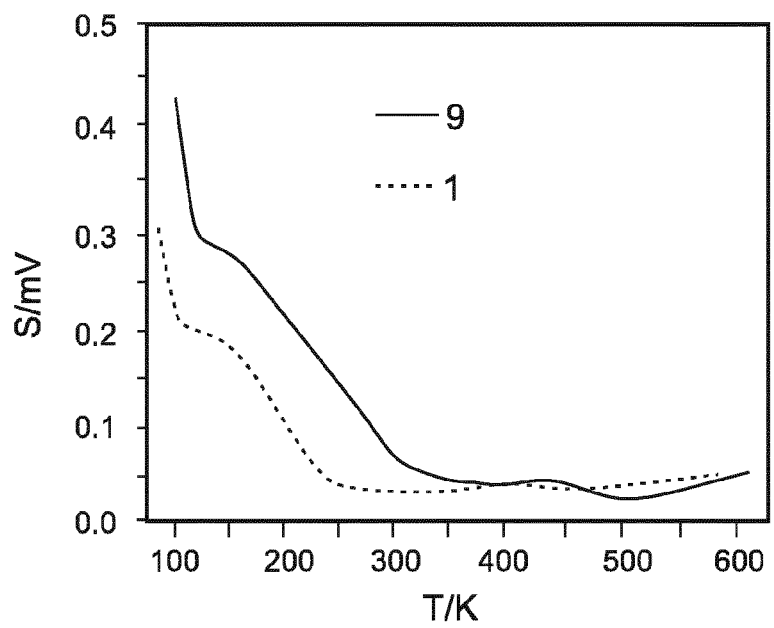
FIG. 8 shows a comparison of a temperature vs. CC-DLTS characteristic between an exemplary embodiment of a power semiconductor device described herein and a modified device.

FIG. 8 shows a comparison of a measured temperature T vs. constant capacitance deep level transient spectroscopy, CC-DLTS, signal S characteristic between the MOS device 1 and the reference device 9. It can be seen that the CC-DLTS signal of the pre-irradiated device 1 is lower than that of the reference device 9, implying a lower $D_{it}$. This occurs in the low temperature side of the CC-DLTS spectrum, that is, close to the conduction band edge.

To prove the effects of electron irradiation, prior to oxidation, TCAD simulations were carried out on SiC MOSFETs. First, a SiC MOSFET with a typical concentration of interface traps of about $10^{12}$ eV$^{-1}$ cm$^{-2}$ was simulated. After that, a SiC MOSFET with the presence of traps that are present after oxidation have been considered, resulting in a $D_{it}$ one order of magnitude lower:

| level | energy position (eV) | capture cross section (cm$^2$) | concentration (cm$^{-3}$) |
|---|---|---|---|
| OF1 | $E_C$ – 0.19 | $3 \times 10^{-17}$ | $3 \times 10^{11}$ |
| OF2 | EC – 0.24 | $10^{-18}$ | $3 \times 10^{11}$ |
| ON1 | EC – 0.79 | $10^{-15}$ | $2 \times 10^{12}$ |
| ON2 | EC – 1.0 | $10^{-16}$ | $4 \times 10^{12}$ |

ON1, ON2, OF1, OF2 may be regarded as labels only. Each electrically active level is located in the bandgap. For instance, OF1 is to be found at 0.19 eV below the conduction band edge. Electrically active levels give rise to a potential well, in which electrons fall. This well has a cross section. The larger, the easier to capture electrons. Also, each electrically active level is linked to a defect which, in turn, has a specified concentration.

Figure 9:
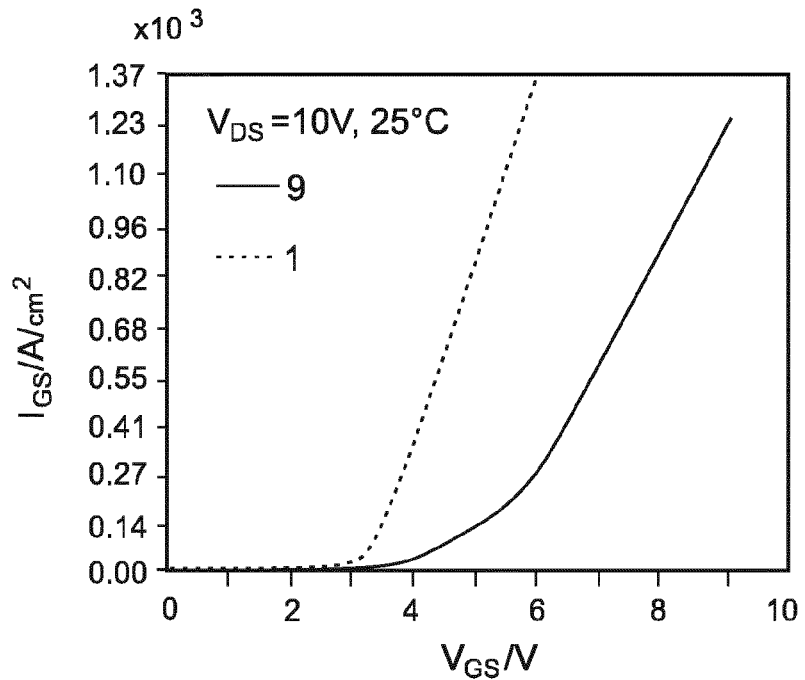
FIG. 9 shows a comparison of a $V_{GS}$ vs. $I_{GS}$ characteristic between an exemplary embodiment of a power semiconductor device described herein and a modified device.
Figure 10:
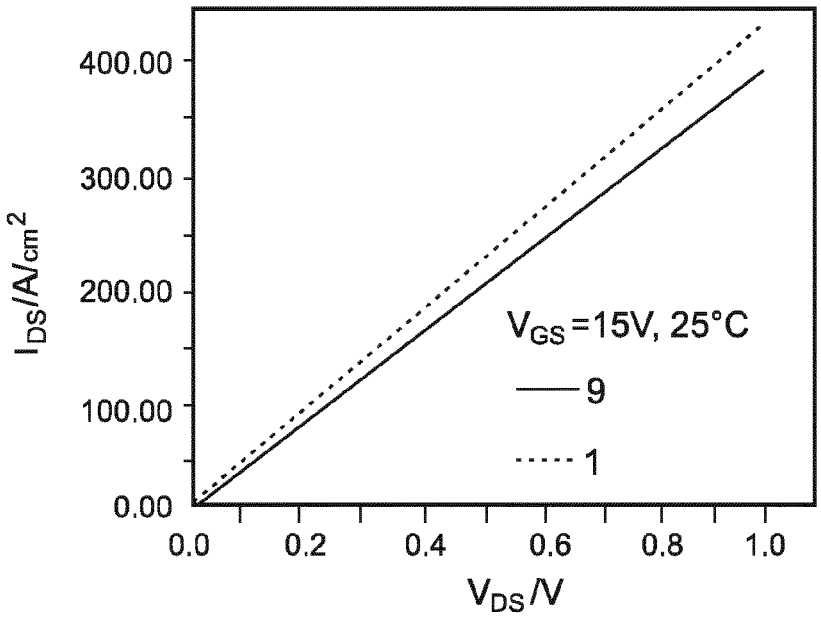
FIG. 10 shows a comparison of a $V_{DS}$ vs. $I_{DS}$ characteristic between an exemplary embodiment of a power semiconductor device described herein and a modified device.

FIG. 9 shows a comparison of a $V_{GS}$ vs. $I_{GS}$ characteristic between an exemplary embodiment of a power semiconductor device 1 described herein and a modified device 9, and FIG. 10 shows a comparison of a $V_{DS}$ vs. $I_{DS}$ characteristic between an exemplary embodiment of a power semiconductor device 1 described herein and a modified device 9. Thus FIG. 9 refers to transfer characteristics and FIG. 10 to output characteristics, with same threshold, of the reference device 9 and pre-oxidation irradiated MOSFET 1 described herein. In FIG. 9, simulations performed on a MOSFET, with standard or lower $D_{it}$ levels, show an improvement of the transfer characteristics if irradiation prior to application of the electrical insulation layer is performed. FIG. 10 show the output characteristics of the same MOSFETs. It can be seen that the curve of the irradiated MOSFET 1 shows an improvement with respect to the reference one 9, meaning that the on-resistance, $R_{ON}$, has decreased.

The components shown in the figures follow, unless indicated otherwise, exemplarily in the specified sequence directly one on top of the other. Components which are not in contact in the figures are exemplarily spaced apart from one another. If lines are drawn parallel to one another, the corresponding surfaces may be oriented in parallel with one another. Likewise, unless indicated otherwise, the positions of the drawn components relative to one another are correctly reproduced in the figures.

REFERENCE SIGNS 1 power semiconductor device
2 semiconductor body
20 top side
21 first portion
22 second portion
23 source region
24 well region
25 drain region
26 drift region
3 electrical insulation layer
4 gate electrode
5 trench
6 mask material
9 modified device
C capacitance in pF
$I_{DS}$ current density between drain and source in A/cm$^2$
$I_{GS}$ current density between gate and source in A/cm$^2$
S CC-DLTS signal in mV
T temperature in K
U voltage in V
$V_{DS}$ voltage between drain and source in V
$V_{GS}$ voltage between gate and source in V

The invention claimed is:

1. A method for producing a power semiconductor device comprising the following steps:
   providing a semiconductor body based on SiC,
   irradiating at least one first portion of a top side of the semiconductor body with low-energy electron radiation having a kinetic energy of at least 116 keV and at most 210 keV, by means of the low-energy electron radiation in the at least one first portion carbon atoms are moved from the top side into the semiconductor body so that after irradiating the at least one first portion, there the semiconductor body has a layer of $Si_{0.5+x}C_{0.5-x}$, wherein x is at least 0.001 and is at most 0.1, said layer has a thickness of at least 10 nm and of at most 0.2 µm, and
   producing an electrical insulation layer at least in the at least one irradiated first portion, wherein the electrical insulation layer is of $SiO_2$.

2. The method according to claim 1, wherein x is at most 0.02.

3. The method according to claim 1, wherein a dose of the low-energy electron radiation in the first portion is at least $10^{12}$ cm$^{-2}$ and at most $10^{17}$ cm$^{-2}$.

4. The method according to claim 1, wherein by producing the electrical insulation layer, an $SiO_2$/n-type 4H—SiC interface is produced.

5. The method according to claim 1, wherein the producing the electrical insulation layer includes annealing a previously applied material of the electrical insulation layer.

6. The method according to claim 5, wherein the annealing is done in an atmosphere containing at least one of nitrogen and oxygen.

7. The method according to claim 1, wherein the irradiating the at least one first portion is done in a nitrogen-containing atmosphere.

8. The method according to claim 1, wherein the top side is a planar surface of the semiconductor body.

9. The method according to claim 1, further including forming at least one trench into the semiconductor body prior to irradiating the at least one first portion, wherein the at least one first portion includes side walls and a bottom face of the at least one trench.

10. The method according to claim 1, wherein prior to irradiating the at least one first portion, a mask material is applied on the top side, during irradiating the at least one first portion the at least one first portion is free of the mask material while remaining portions of the top side are covered by the mask material.

11. The method according to claim 1, wherein directly on a side of the electrical insulation layer remote from the semiconductor body a gate electrode is formed, the gate electrode is of poly-Si, wherein, seen in cross-section perpendicular to the top side, the electrical insulation layer as well as the gate electrode extend as hole-free, closed layers across a well region from a source region to a drain region.

* * * * *